US009947771B2

(12) United States Patent
Park (10) Patent No.: US 9,947,771 B2
(45) Date of Patent: Apr. 17, 2018

(54) THIN FILM TRANSISTOR AND METHOD OF FABRICATING THE SAME

(71) Applicant: Samsung Display Co., Ltd., Yongin (KR)

(72) Inventor: Byoung-Keon Park, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/729,381

(22) Filed: Jun. 3, 2015

(65) Prior Publication Data

US 2015/0263135 A1  Sep. 17, 2015

Related U.S. Application Data

(62) Division of application No. 11/166,145, filed on Jun. 27, 2005, now Pat. No. 9,070,716.

(30) Foreign Application Priority Data

Jun. 29, 2004  (KR) .................. 10-2004-0049823

(51) Int. Cl.
*H01L 29/66*  (2006.01)
*H01L 29/49*  (2006.01)
(Continued)

(52) U.S. Cl.
CPC .... *H01L 29/66757* (2013.01); *H01L 21/0217* (2013.01); *H01L 21/02164* (2013.01); (Continued)

(58) Field of Classification Search
CPC ......... H01L 29/66757; H01L 21/02164; H01L 21/0217; H01L 21/02532; H01L 21/02595; H01L 21/31111
(Continued)

(56) References Cited

U.S. PATENT DOCUMENTS 3,829,888 A * 8/1974 Hashimoto ............. H01L 29/00
257/392
4,669,062 A * 5/1987 Nakano ................. G11C 11/405
257/368

(Continued)

FOREIGN PATENT DOCUMENTS

JP  04-219736  8/1992
JP  04-291240  10/1992
(Continued)

OTHER PUBLICATIONS

Non-Final Office Action dated Sep. 18, 2007 in U.S. Appl. No. 11/166,145.
(Continued)

*Primary Examiner* — Ori Nadav
(74) *Attorney, Agent, or Firm* — H.C. Park & Associates, PLC (57) ABSTRACT

A method of fabricating a thin film transistor includes forming a substrate having first and second regions, a semiconductor layer pattern formed in the first region and the second region, and a first gate insulating layer pattern formed on a channel region of the semiconductor layer pattern of the first region. A second gate insulating layer is formed on the substrate, a first conductive layer pattern is formed above the channel region of the first region and above the semiconductor layer pattern of the second region, and an inter-layer insulating layer is formed on the substrate. A second conductive layer pattern is formed in the first region and above the first conductive layer pattern of the second region. The second conductive layer pattern of the first region is coupled to the semiconductor layer pattern of the first region through the second gate insulating layer and the inter-layer insulating layer.

8 Claims, 10 Drawing Sheets

(51) Int. Cl.
  *H01L 27/12* (2006.01)
  *H01L 21/02* (2006.01)
  *H01L 21/311* (2006.01)
  *H01L 29/423* (2006.01)
  *H01L 29/51* (2006.01)
  *H01L 27/32* (2006.01)

(52) U.S. Cl.
  CPC .. *H01L 21/02532* (2013.01); *H01L 21/02595* (2013.01); *H01L 21/31111* (2013.01); *H01L 21/31144* (2013.01); *H01L 27/1255* (2013.01); *H01L 29/42364* (2013.01); *H01L 29/4908* (2013.01); *H01L 29/518* (2013.01); *H01L 27/3244* (2013.01)

(58) Field of Classification Search
  USPC ....... 438/149, 151, 155, 164, 239, 251, 253, 438/393, 486; 257/347–354
  See application file for complete search history.

(56) References Cited

U.S. PATENT DOCUMENTS

| | | | |
|---|---|---|---|
| 5,698,864 | A | 12/1997 | Mano et al. |
| 6,075,268 | A * | 6/2000 | Gardner ............ H01L 21/8221 257/327 |
| 6,093,934 | A * | 7/2000 | Yamazaki .......... H01L 21/2022 257/347 |
| 6,137,551 | A * | 10/2000 | Jeong ................. H01L 27/1214 257/59 |
| 6,172,721 | B1 | 1/2001 | Murade et al. |
| 6,323,070 | B1 * | 11/2001 | Yamazaki ............... H01L 27/12 257/E27.111 |
| 6,593,592 | B1 | 7/2003 | Yamazaki et al. |
| 6,812,975 | B2 * | 11/2004 | Nagahiro .......... G02F 1/136213 349/38 |
| 2001/0055841 | A1 * | 12/2001 | Yamazaki .......... H01L 27/1214 438/151 |
| 2002/0125477 | A1 * | 9/2002 | So .................... G02F 1/136227 257/59 |
| 2003/0102478 | A1 * | 6/2003 | Joo .................. H01L 29/66757 257/72 |
| 2006/0138922 | A1 * | 6/2006 | Kim .................... H01L 27/3244 313/11 |
| 2007/0296003 | A1 * | 12/2007 | Park .................. H01L 29/42384 257/288 |
| 2011/0223754 | A1 * | 9/2011 | Ramin ............. H01L 21/28097 438/585 |

FOREIGN PATENT DOCUMENTS

| | | |
|---|---|---|
| JP | 05-029622 | 2/1993 |
| JP | 2000-332258 | 11/2000 |
| JP | 2002-124677 | 4/2002 |
| JP | 2002-359252 | 12/2002 |

OTHER PUBLICATIONS

Final Office Action dated Mar. 5, 2008 in U.S. Appl. No. 11/166,145.
Non-Final Office Action dated Jul. 1, 2008 in U.S. Appl. No. 11/166,145.
Final Office Action dated Dec. 5, 2008 in U.S. Appl. No. 11/166,145.
Non-Final Office Action dated Jun. 1, 2009 in U.S. Appl. No. 11/166,145.
Final Office Action dated Nov. 5, 2009 in U.S. Appl. No. 11/166,145.
Non-Final Office Action dated May 27, 2010 in U.S. Appl. No. 11/166,145.
Non-Final Office Action dated Sep. 7, 2010 in U.S. Appl. No. 11/166,145.
Final Office Action dated Jan. 21, 2011 in U.S. Appl. No. 11/166,145.
Non-Final Office Action dated May 4, 2011 in U.S. Appl. No. 11/166,145.
Final Office Action dated Sep. 8, 2011 in U.S. Appl. No. 11/166,145.
Examinees Answer to Appeal Brief dated Mar. 14, 2012 in U.S. Appl. No. 11/166,145.
Patent Board Decision dated Dec. 11, 2014 in U.S. Appl. No. 11/166,145.
Notice of Allowance dated Feb. 25, 2015 in U.S. Appl. No. 11/166,145.

* cited by examiner

THIN FILM TRANSISTOR AND METHOD OF FABRICATING THE SAME

This application is a Divisional Application of U.S. patent application Ser. No. 11/166,145, filed on Jun. 27, 2005, now U.S. Pat. No. 9,070,716, and claims priority to and the benefit of Korean Patent Application No. 10-2004-0049823, filed Jun. 29, 2004, which are hereby incorporated by reference for all purposes as if fully set forth herein.

BACKGROUND OF THE INVENTION

Field

The present invention relates to a thin film transistor (TFT) and method of fabricating the same and, more particularly, to a TFT and method of fabricating the same in which a capacitor's surface area may be decreased without decreasing its capacity.

Discussion of the Background

Generally, a flat panel display device such as an active matrix organic light emitting display (OLED) has a TFT in each pixel, and each pixel may be coupled to a gate line, a data line and a power supply line and further include a capacitor and an organic light emitting diode. A plurality of conductive layers may be used to form a gate line, a gate electrode, a data line, source and drain electrodes, a power supply layer, an anode electrode, and so forth. Such conductive layers may be electrically connected to each other by forming a contact hole in an insulating layer interposed between conductive layers and then burying the conductive layer.

Figure 1:
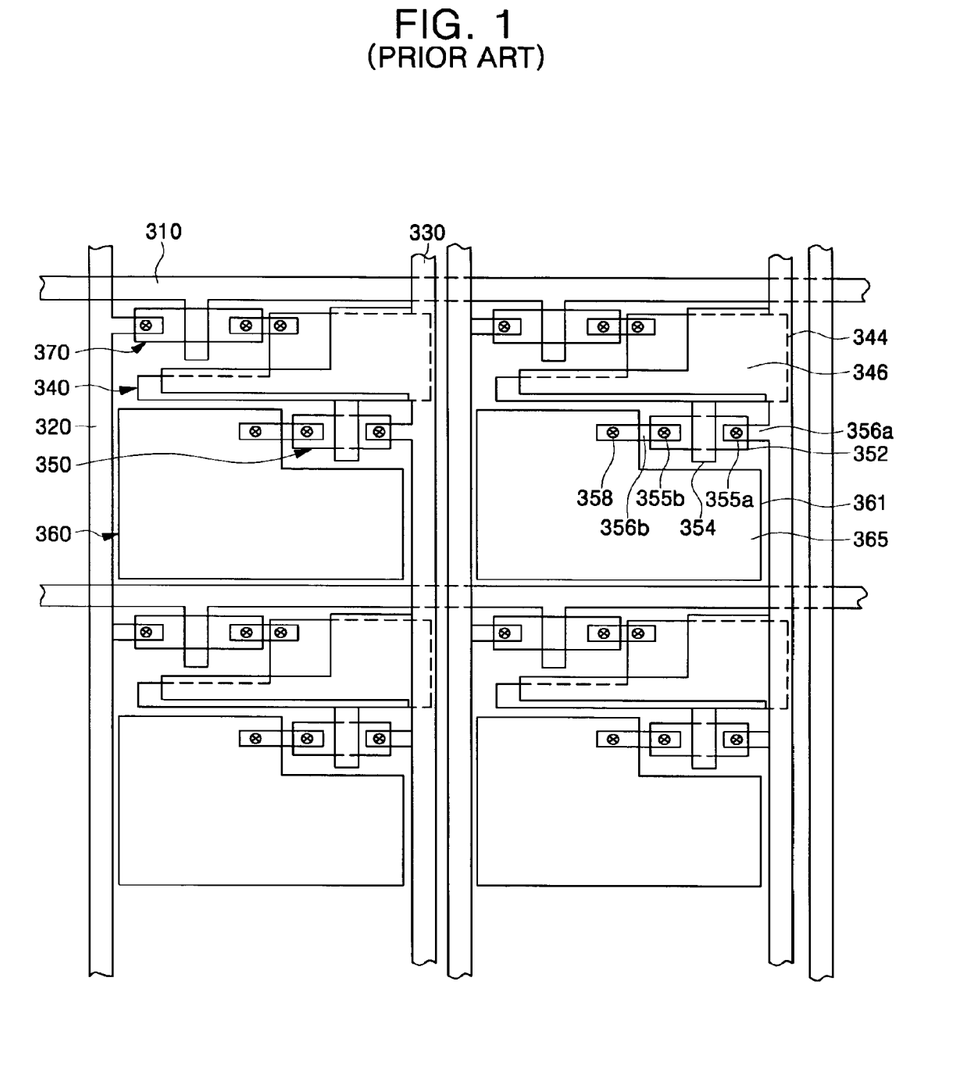
FIG. 1 is a plan view showing a conventional organic light emitting display.

FIG. 1 is a plan view showing a conventional active matrix OLED.

Referring to FIG. 1, the conventional active matrix OLED may include a plurality of gate lines 310, a plurality of data lines 320, a plurality of power supply lines 330, and a plurality of pixels connected to the gate lines 310, the data lines 320, and the power supply lines 330.

Each pixel may include switching and driving TFTs, a capacitor and a light emitting diode. The switching TFT 370 is connected to a gate line 310 and a data line 320, the driving TFT 350 drives the light emitting diode 360 and is connected to the power supply line 330, the capacitor 340 maintains a gate-source voltage of the driving TFT 350, and the light emitting diode 360 emits light to display an image.

The driving TFT 350 has a semiconductor layer 352 including source and drain regions, a gate electrode 354, and source and drain electrodes 356a and 356b connected to the source and drain regions through contact holes 355a and 355b, respectively. The switching TFT 370 may have the same structure.

The capacitor 340 includes a bottom electrode 344 connected to a gate of the driving TFT 350 and, for example, to the drain electrode of the switching TFT 370, and a top electrode 346 connected to the power supply line 330 and, for example, to the source electrode 356a of the driving TFT 350. A pixel electrode 361, which may act as an anode of the light Is emitting diode having an opening 365, may be connected, for example, to the drain electrode 356b of the driving TFT 350 through a via hole 358.

Figure 2A:
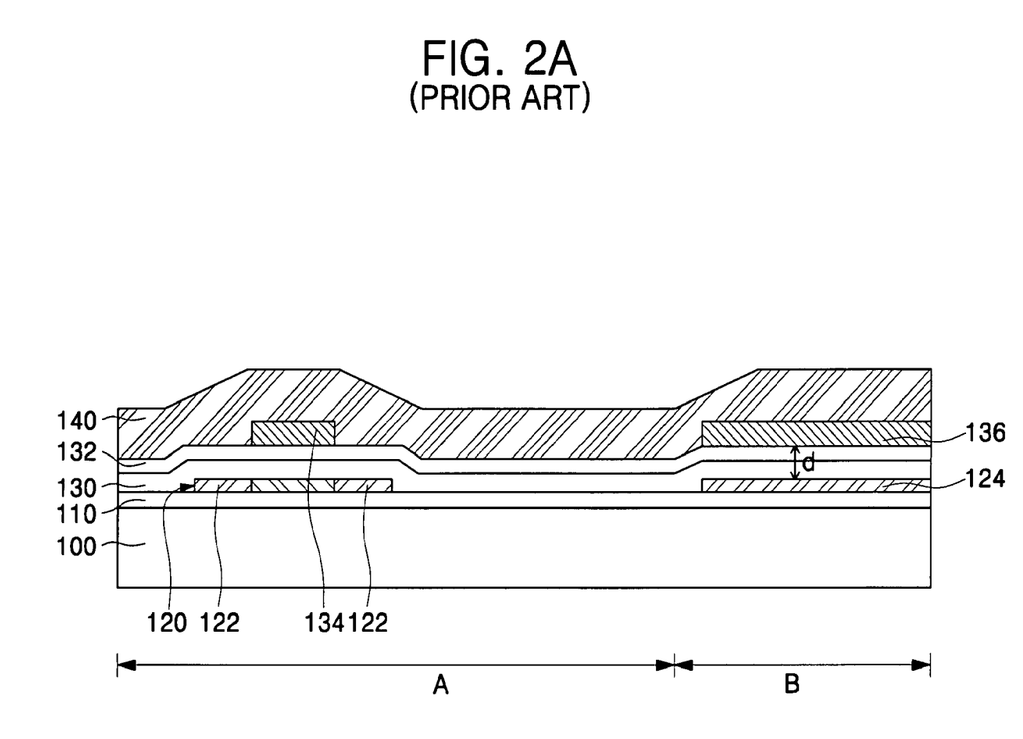
FIG. 2A and FIG. 2B are cross-sectional views showing a sequence of forming a TFT according to a conventional method.
Figure 2B:
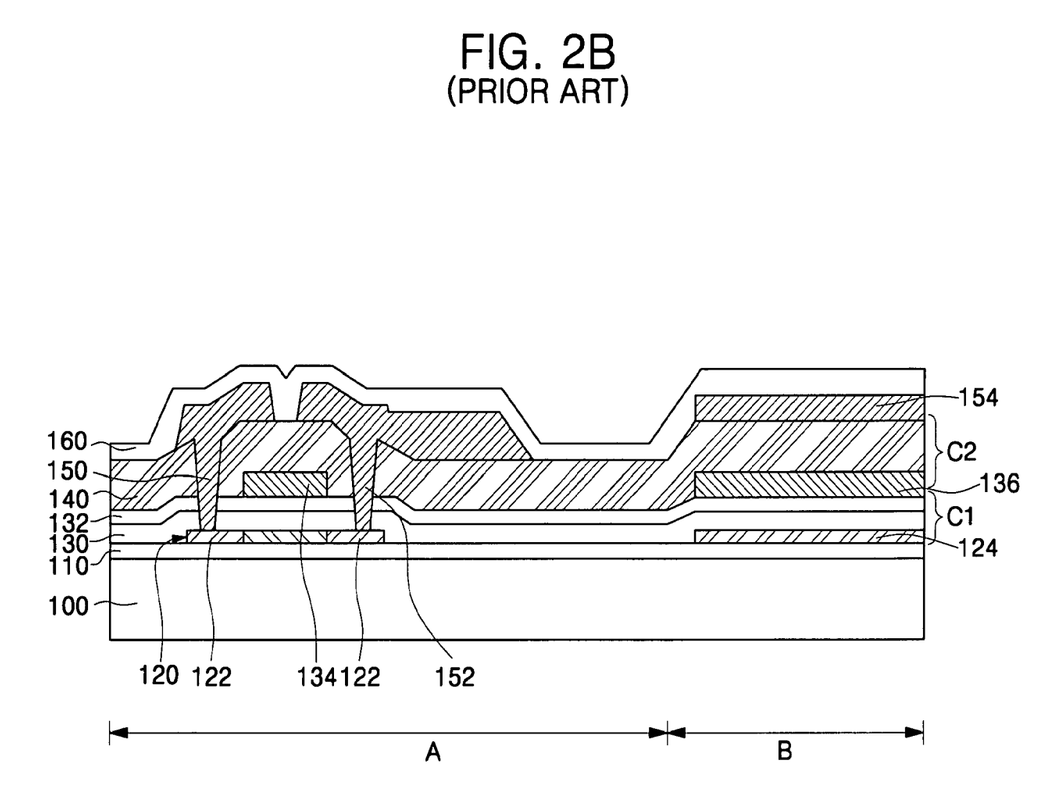

FIG. 2A and FIG. 2B are cross-sectional views showing a sequence of forming a TFT according to a conventional method.

Referring to FIG. 2A, a buffer layer 110 may be formed on the entire surface of a 20 substrate 100, which is divided into a first region A and a second region B. The buffer layer 110 may be made of silicon oxide having a predetermined

2 thickness, and it may be formed using a plasma-enhanced chemical vapor deposition (PECVD) method. In this case, the buffer layer 110 may prevent impurities from the substrate 100 from penetrating layers above the buffer layer 110.

Next, an amorphous silicon layer (not shown) having a predetermined thickness may be deposited on the buffer layer 110. The amorphous silicon layer may then be crystallized by, for example, excimer laser annealing (ELA), sequential lateral solidification (SLS), metal induced crystallization (MIC), metal induced lateral crystallization (MILC), and so forth, and then patterned using photolithography to thereby form polycrystalline silicon layer patterns 120 in the first region A and the second region B within the unit pixel.

A first gate insulating layer 130 may then be formed on the entire surface of the substrate. In this case, the first gate insulating layer 130 may be formed of a silicon oxide ($SiO_2$) layer or a silicon nitride (SiNx) layer, and it may be about 400 Å to 1,000 Å thick.

A photoresist layer pattern (not shown), which corresponds to a channel region of the transistor, may then be formed on the first gate insulating layer 130. Impurity ions may be implanted into the polycrystalline silicon layer pattern 120 using the photoresist layer pattern as an ion implantation mask, thereby forming source and drain regions 122 in the polycrystalline silicon layer pattern 120 in the first region A and a first electrode 124, which may be used as a bottom electrode of a lower capacitor C1, in the polycrystalline silicon layer pattern 120 in the second region B. The photoresist layer pattern may then be removed.

Next, a second gate insulating layer 132 may be formed on the first gate insulating layer 130. The second gate insulating layer 132 may be formed of a $SiO_2$ layer or a SiNx layer, and it may be about 200 Å to 800 Å thick. Alternatively, the second gate insulating layer 132 may be formed before implanting impurity ions into the polycrystalline silicon layer pattern 120 as described above.

A metal layer (not shown) for forming the gate electrode may be formed on the second gate insulating layer 132. The metal layer may be formed of a single layer of molybdenum (Mo) or an alloy such as molybdenum tungsten (MoW), a single layer of aluminum (Al) or an alloy such as aluminum-neodymium (Al—Nd), or a double layer containing these metals. The metal layer may be etched using photolithography to form a gate electrode 134 in the first region A and a second electrode 136, which may be used as a top electrode of the lower capacitor C1, in the second region B. In this case, the second electrode 136 may be used as the top electrode of the lower capacitor C1 and also as a bottom electrode of an upper capacitor C2. Hence, a stacked structure d including the first gate insulating layer 130 and the second gate insulating layer 132 may be used as a dielectric layer of the lower capacitor C1.

An inter-layer insulating layer 140 may then be formed to a predetermined thickness on the entire surface of the substrate. In this case, a $SiO_2$ layer and a SiNx layer may be stacked to form the inter-layer insulating layer 140, which may be about 3,000 Å to 5,000 Å thick.

Referring to FIG. 2B, the inter-layer insulating layer 140, the first gate insulating layer 130, and the second gate insulating layer 132 may then be etched by photolithography to form contact holes exposing the source and drain regions 122, respectively.

An electrode material may then be formed on the entire surface of the substrate including the contact holes and etched using photolithography to form source and drain electrodes 150 and 152, which are connected to the source and drain regions 122, respectively, in the first region A and a third electrode 154, which may be used as a top electrode of the upper capacitor C2 in the second region B. In this case, a single layer of Mo or an alloy such as MoW, a single layer of Al or an alloy such as Al—Nd, or a double layer containing these metals may be employed for the electrode material.

A passivation layer 160, which may be made of an inorganic insulating layer such as a SiNx layer, may then be formed to a predetermined thickness on the entire surface of the substrate.

In the method of fabricating the TFT having the above-mentioned structure, the polycrystalline silicon layer pattern, the gate insulating layers and the gate electrode are used as the lower capacitor C1, and the gate electrode, the inter-layer insulating layer and the drain electrode are used as the upper capacitor C2. The lower capacitor C1 and the upper capacitor C2 are formed within the same area. The lower capacitor C1 has two gate insulating layers as a dielectric layer, and the upper capacitor C2 has the inter-layer insulating layer as a dielectric layer. Hence, a capacitor within a pixel may occupy a relatively large area, and a capacitor having high capacity may be required as devices are highly integrated. However, the capacitor's surface area may need to increase to increase its capacity, which inevitably causes the aperture ratio of the organic light emitting display to decrease.

SUMMARY OF THE INVENTION

The present invention provides a TFT and method of fabricating the same, in which a surface area of a capacitor may be decreased without changing the magnitude of capacitance of the capacitor by partially decreasing the thickness of a gate insulating layer in an organic light emitting display using the dual gate insulating layer to thereby increase an aperture ratio of the organic light emitting display.

Additional features of the invention will be set forth in the description which follows, and in part will be apparent from the description, or may be learned by practice of the invention.

The present invention discloses a thin film transistor including a substrate having a first region and a second region, a semiconductor layer pattern formed in the first region and the second region, and a first gate insulating layer pattern formed on a channel region of the semiconductor layer pattern of the first region. A second gate insulating layer is formed on the substrate, a first conductive layer pattern is formed above the channel region of the first region and above the semiconductor layer pattern of the second region, and an inter-layer insulating layer is formed on the substrate. A second conductive layer pattern is formed in the first region and above the first conductive layer pattern of the second region. The second conductive layer pattern of the first region is coupled to the semiconductor layer pattern of the first region through the second gate insulating layer and the inter-layer insulating layer.

The present invention also discloses a method of fabricating a thin film transistor including forming a polycrystalline silicon layer pattern in a first region and a second region of a substrate, forming a first gate insulating layer on the substrate, forming a photoresist layer pattern protecting a channel region of the polycrystalline silicon layer pattern of the first region and the second region of the first region, and doping the polycrystalline silicon layer pattern using the photoresist layer pattern as a mask to form a source region and a drain region in the first region and to form a first electrode in the second region, etching the first gate insulating layer using the photoresist layer pattern as a mask to form a first gate insulating layer pattern and then removing the photoresist layer pattern, forming a second gate insulating layer on the substrate, forming a gate electrode in the first region of the substrate and a second electrode in the second region of the substrate, forming an inter-layer insulating layer on the substrate, etching the inter-layer insulating layer and the second gate insulating layer to expose the source region and the drain region, and forming a source electrode and a drain electrode coupled to the source region and the drain region, respectively, and forming a third electrode in the second region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Reference will now be made in detail to embodiments of the present invention, examples of which are illustrated in the accompanying drawings, wherein like reference numerals refer to the like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

FIG. 3A, FIG. 3B, FIG. 3C, FIG. 3D, FIG. 3E, FIG. 3F and FIG. 3G are cross-sectional views showing a sequence of forming a TFT according to an embodiment of the present invention, which may be used to form an N type metal oxide semiconductor (NMOS) TFT, a PMOS TFT, or a complementary MOS (CMOS) TFT.

Figure 3A:
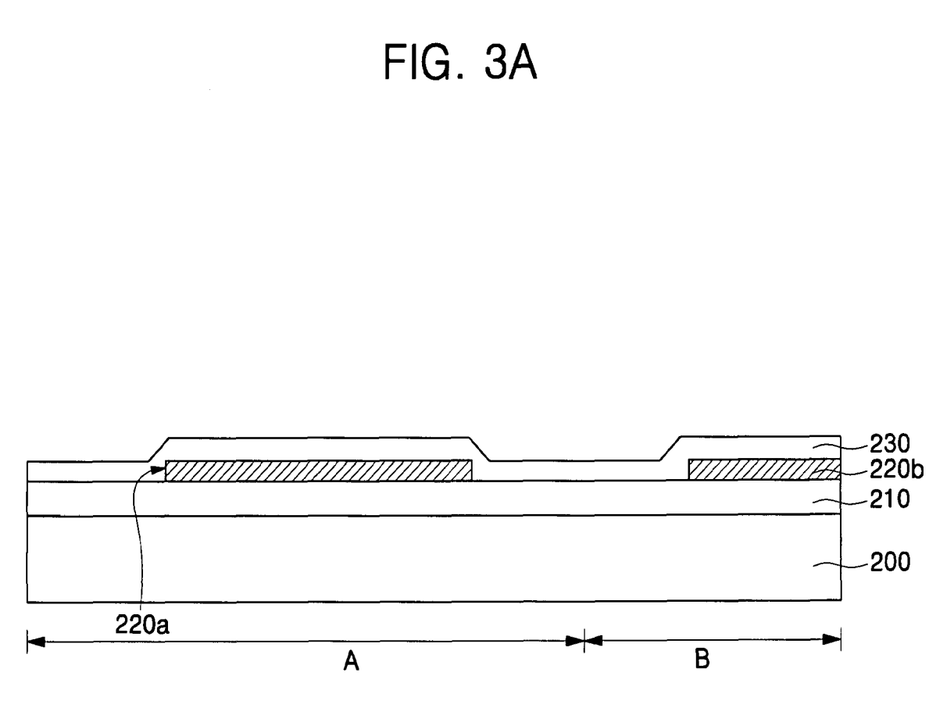
FIG. 3A, FIG. 3B, FIG. 3C, FIG. 3D, FIG. 3E, FIG. 3F and FIG. 3G are cross-sectional views showing a sequence of forming a TFT according to an embodiment of the present invention.

Referring to FIG. 3A, a buffer layer 210 may be formed on the entire surface of a substrate 200, which is divided into a first region A and a second region B. The buffer layer 210 may be made of, for example, a silicon oxide ($SiO_2$) layer having a predetermined thickness, and it may be formed using, for example, plasma-enhanced chemical vapor deposition (PECVD). In this case, the buffer layer 210 may prevent impurities from the substrate 200 from penetrating layers above the buffer layer 210.

Next, an amorphous silicon layer (not shown) having a predetermined thickness may be deposited on the buffer layer 210. The amorphous silicon layer may then be crystallized using, for example, excimer laser annealing (ELA), sequential lateral solidification (SLS), metal induced crystallization (MIC), metal induced lateral crystallization (MILC), and so forth. The polycrystalline silicon layer may then be patterned using, for example, photolithography to thereby form polycrystalline silicon layer patterns 220a and 220b in first region A and second region B, respectively, within the unit pixel.

A first gate insulating layer 230 may then be formed on the entire surface of the substrate. In this case, the first gate insulating layer 230 may be formed of, for example, a SiO$_2$ layer or a silicon nitride (SiNx) layer, and it may be about 400 Å to 1,000 Å thick, preferably about 800 Å thick.

Figure 3B:
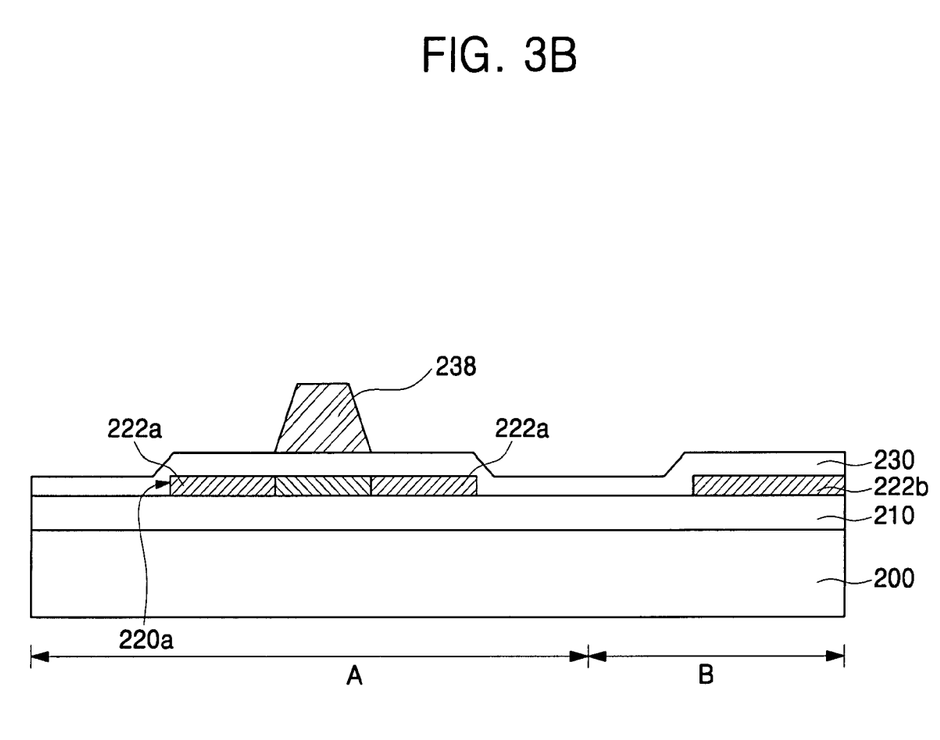

Referring to FIG. 3B, a photoresist layer pattern 238, which corresponds to a channel region of the transistor, may then be formed on the first gate insulating layer 230 in the first region A. Impurity ions may be implanted into the polycrystalline silicon layer patterns 220a and 220b using the photoresist layer pattern 238 as an ion implantation mask, thereby forming source and drain regions 222a and a first electrode 222b, which may be used as a bottom electrode of a lower capacitor C1. Here, the ion implantation process may be performed using an n+ impurity or a p+ impurity as a dopant. When the TFT is to be a CMOS TFT, the n+ impurity may be implanted into the first electrode 222b.

Figure 3C:
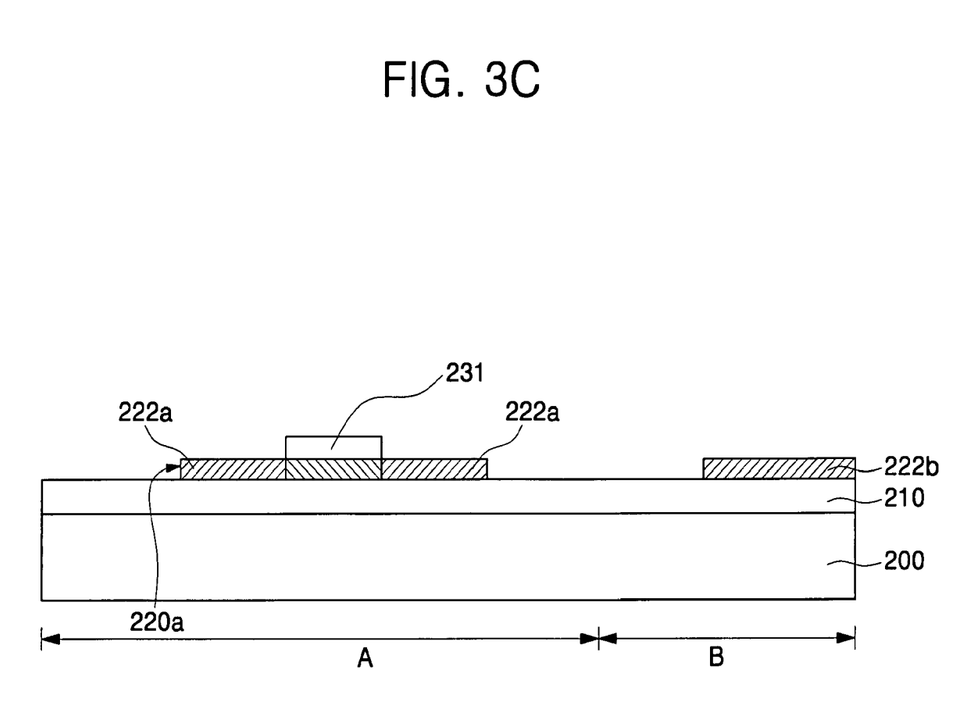

Referring to FIG. 3C, the first gate insulating layer 230 may be etched using the photoresist layer pattern 238 as an etch mask to form a first gate insulating layer pattern 231 above the channel region of the transistor.

The photoresist layer pattern 238 may then be removed.

Alternatively, in the case of the NMOS TFT having a lightly doped drain (LDD) region, the first gate insulating layer pattern 231 may extend to the LDD region beyond the channel region.

Figure 3D:
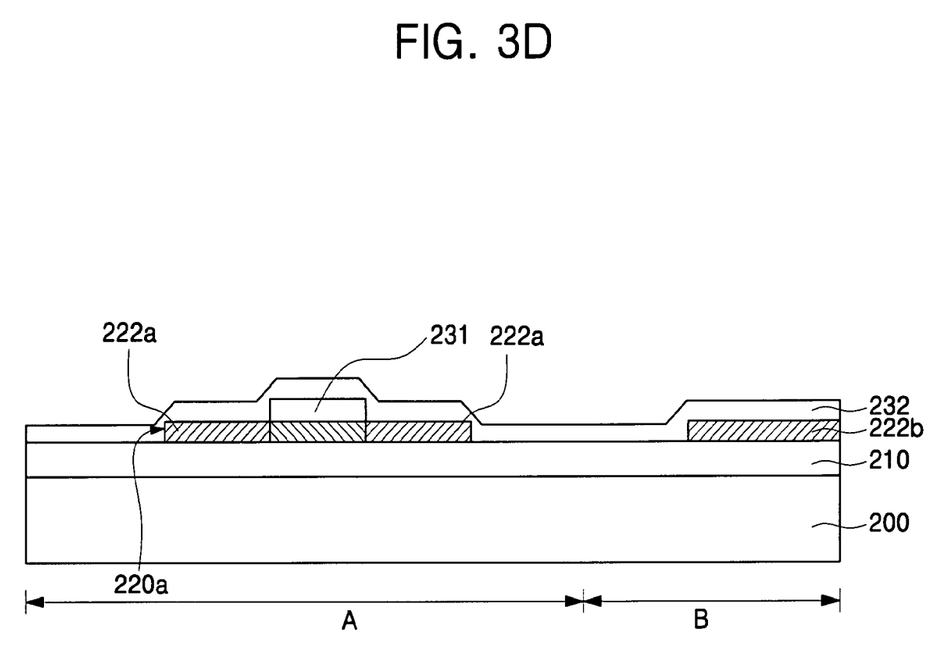

Referring to FIG. 3D, a second gate insulating layer 232 may be formed on the entire surface of the substrate. The second gate insulating layer 232 may be formed of, for example, SiO$_2$ or SiN$_x$, and it may be about 200 Å to 800 Å thick, and is preferably formed of SiN$_x$ at a thickness of about 400 Å.

Figure 3E:
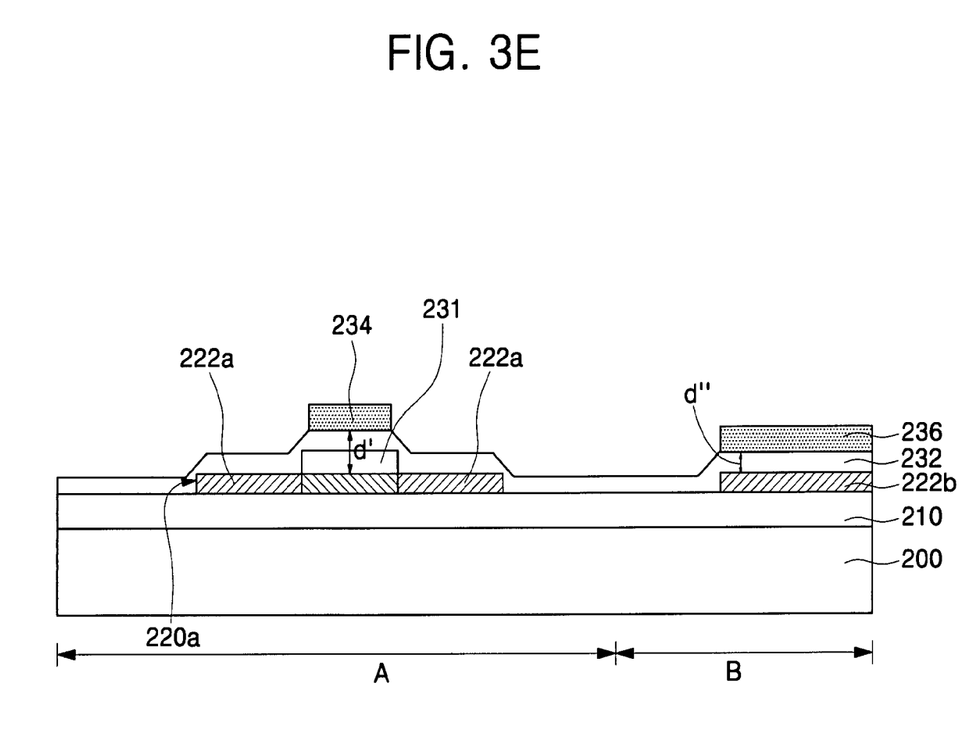

Referring to FIG. 3E, a first conductive layer (not shown) may be formed on the second gate insulating layer 232. The first conductive layer may be formed of, for example, a single layer of Mo or an alloy such as MoW, a single layer of Al or an alloy such as Al—Nd, or a double layer containing these metals. The first conductive layer may be etched using, for example, photolithography to form a first conductive layer pattern including a gate electrode 234 formed in the first region A and a second electrode 236 formed in the second region B. In this case, the second electrode 236 may be used as the top electrode of the lower capacitor C1 and also as a bottom electrode of an upper capacitor C2. The first gate insulating layer pattern 231 and the second gate insulating layer 232 may be used as a gate insulating layer d', and they may be about 600 Å to 1,800 Å thick in the first region A. Additionally, the second gate insulating layer 232 may be used as a dielectric layer d" of the lower capacitor C1, and it may be about 200 Å to 800 Å thick, preferably about 400 Å thick, in the second region B.

Figure 3F:
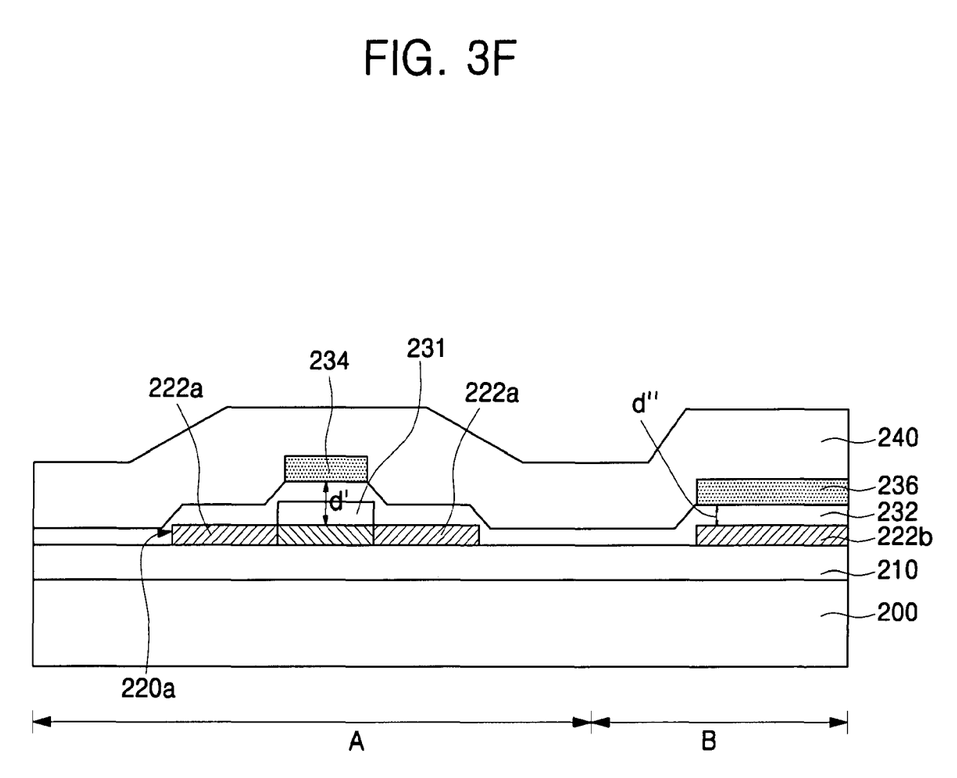

Referring to FIG. 3F, an inter-layer insulating layer 240 may then be formed to a predetermined thickness on the entire surface of the substrate. The inter-layer insulating layer 240 may be formed of, for example, a SiO$_2$ layer, and it may be about 3,000 Å to 5,000 Å thick, preferably about 4,000 Å thick.

Figure 3G:
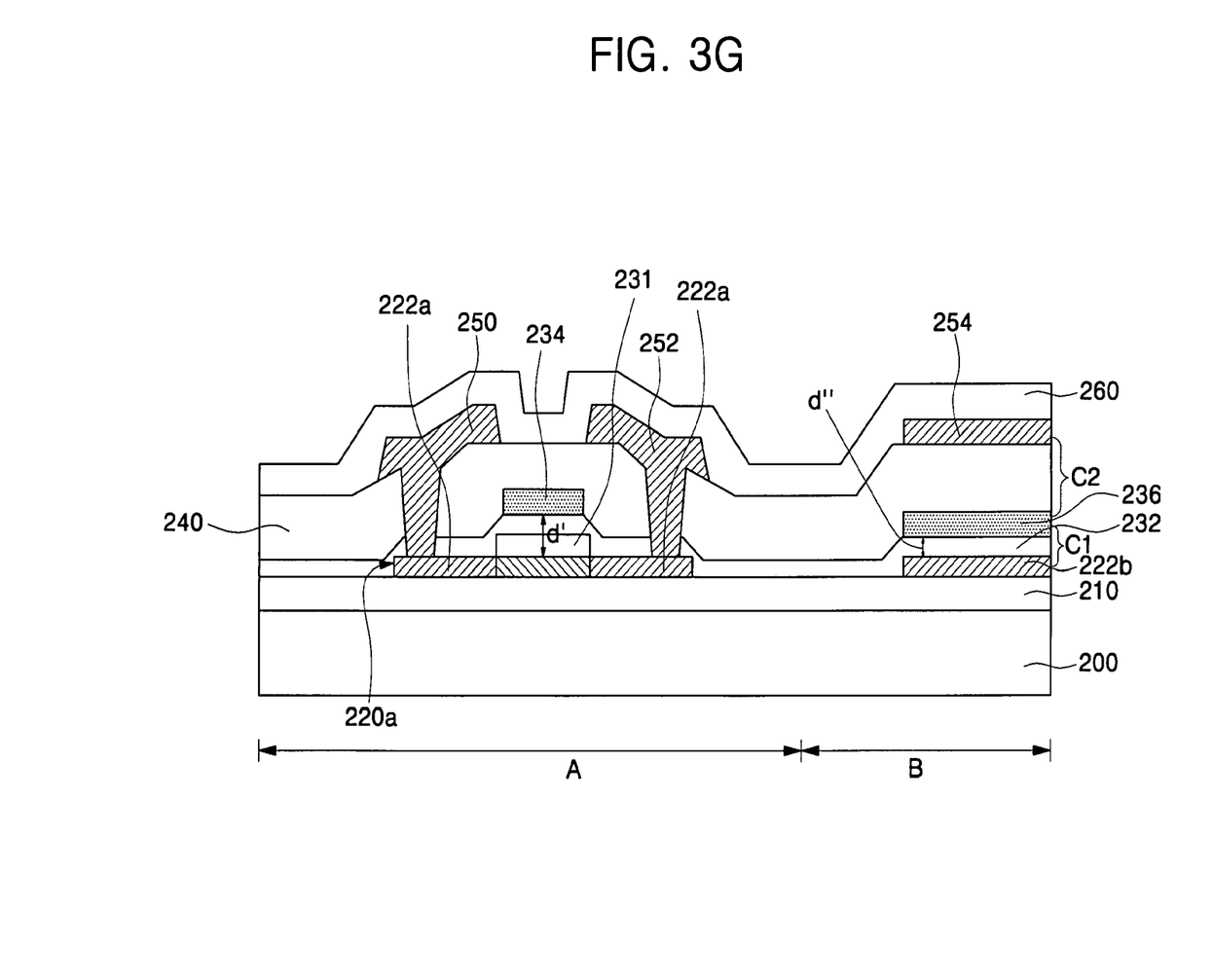

Referring to FIG. 3G, the inter-layer insulating layer 240 and the second gate insulating layer 232 may be etched using, for example, photolithography to form contact holes exposing the source and drain regions 222a, respectively.

A second conductive layer may then be formed on the entire surface of the substrate including the contact holes and etched using, for example, photolithography to form a second conductive layer pattern including source and drain electrodes 250 and 252 formed in the first region A and a third electrode 254 formed in the second region B. The source and drain electrodes 250 and 252 may be coupled to the source and drain regions 222a, respectively, and the third electrode 254 may be used as a top electrode of the upper capacitor C2. Here, for example, the second conducive layer may be made of a single layer of Mo or an alloy such as MoW, a single layer of Al or an alloy such as Al—Nd, or a double layer containing these metals.

A passivation layer 260, which may be formed of, for example, an inorganic insulating layer such as a SiN$_x$ layer having a predetermined thickness, may then be formed on the entire surface of the substrate.

The capacitor is vertically formed within the same area in which the lower and upper capacitors C1 and C2 are formed as shown in FIG. 3G.

For example, when the first gate insulating layer 230 is about 800 Å thick, the second gate insulating layer 232 is about 400 Å thick, and the inter-layer insulating layer 240 is about 4,000 Å thick, the surface area of the capacitor according to an embodiment of the present invention may be expressed by the following equation 1:

$$A = \frac{Cst}{\frac{\varepsilon\, ILD}{dILD} + \frac{1}{\frac{dGI1}{\varepsilon\, GI1} + \frac{dGI2}{\varepsilon\, GI2}}}$$

($\in$ is a dielectric constant, d is a thickness of the dielectric layer, Cst is a capacitance, ILD is an inter-layer insulating layer, GI1 is a first gate insulating layer, and GI2 is a second gate insulating layer) and where the lower capacitor C1 has only the second gate insulating layer 232 as the dielectric layer (i.e. GI1=0), the surface area of the capacitor may be expressed by the following equation 2:

$$A' = \frac{Cst}{\frac{\varepsilon\, ILD}{dILD} + \frac{\varepsilon\, GI2}{dGI2}}$$

When a pixel includes a five transistor and two capacitor structure under the conditions described above, the surface area of the capacitor may decrease by about 27% and the pixel's resultant aperture ratio may be enhanced by 10% or more.

Additionally, when a pixel includes a two transistor and one capacitor structure, the surface area of the capacitor may decrease by about 27% and the pixel's resultant aperture ratio may be enhanced by 2.7% or more.

According to embodiments of the present invention, when the OLED using a double gate insulating layer is fabricated, the thickness of the gate insulating layer in the TFT region may be different from that in the capacitor region. Accordingly, the electrical characteristics of the gate electrode may be maintained and the surface area of the capacitor may decrease without changing the capacitance of the capacitor.

Decreasing the surface area of the capacitor may enhance the aperture ratio of the OLED, and the effect of the enhanced aperture ratio may be more enhanced when the capacitance is increased to decrease the leakage current.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a thin film transistor, comprising:
   forming a polycrystalline silicon layer pattern in a first region and a second region of a substrate;
   forming a first gate insulating layer on the substrate;
   forming a photoresist layer pattern protecting a channel region of the polycrystalline silicon layer pattern of the first region;
   doping the polycrystalline silicon layer pattern of the first region and the second region using the photoresist layer pattern as a mask to form a source region and a drain region in the first region and to form a first electrode in the second region;
   etching the first gate insulating layer using the photoresist layer pattern as a mask to form a first gate insulating layer pattern disposed on the first region and not disposed on the second region, and then removing the photoresist layer pattern;
   forming a second gate insulating layer on the first gate insulating layer pattern of the first region and the first electrode of the second region;
   forming a gate electrode on the second gate insulating layer in the first region of the substrate, and a second electrode in the second region of the substrate;
   forming an inter-layer insulating layer on the substrate;
   etching the inter-layer insulating layer and the second gate insulating layer to expose the source region and the drain region; and
   forming a source electrode and a drain electrode coupled to the source region and the drain region, respectively, and forming a third electrode in the second region,
   wherein a first gap between the gate electrode and the polycrystalline silicon layer pattern of the first region is greater than a second gap between the second electrode and the first electrode of the second region, and
   wherein the first gap is formed by the first gate insulating pattern and the second insulating layer, and the second gap is formed by the second insulating layer.

2. The method of claim 1, wherein the first electrode is a bottom electrode of a lower capacitor.

3. The method of claim 1, wherein the first gate insulating layer is formed of any one of a silicon oxide layer and a silicon nitride layer.

4. The method of claim 3, wherein the first gate insulating layer is about 400 Å to about 1,000 Å thick.

5. The method of claim 1, wherein the second gate insulating layer is formed of any one of a silicon oxide layer and a silicon nitride layer.

6. The method of claim 5, wherein the second gate insulating layer is about 200 Å to about 800 Å thick.

7. The method of claim 1, wherein the second electrode is a top electrode of a lower capacitor and a bottom electrode of an upper capacitor.

8. The method of claim 1, wherein the third electrode is a top electrode of an upper capacitor.

* * * * *